(12) United States Patent
Chu

(10) Patent No.: US 7,623,767 B2
(45) Date of Patent: Nov. 24, 2009

(54) REAL TIME DATA COMPRESSION APPARATUS FOR A DATA RECORDER

(75) Inventor: Yao-Tung Chu, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 862 days.

(21) Appl. No.: 11/207,039

(22) Filed: Aug. 18, 2005

(65) Prior Publication Data

US 2005/0276578 A1 Dec. 15, 2005

Related U.S. Application Data

(62) Division of application No. 10/623,671, filed on Jul. 21, 2003, now Pat. No. 6,950,041.

(30) Foreign Application Priority Data

Dec. 26, 2002 (TW) .............................. 91137434 A

(51) Int. Cl.
*H04N 7/26* (2006.01)
(52) U.S. Cl. ...................................... 386/109; 386/111
(58) Field of Classification Search ......... 386/109–112, 386/45–46, 125–126
See application file for complete search history.

(56) References Cited

U.S. PATENT DOCUMENTS

| 5,235,126 A | 8/1993 | Bruti et al. |
| 6,169,846 B1 * | 1/2001 | Ohishi ........................ 386/109 |
| 2002/0168178 A1 * | 11/2002 | Rodriguez et al. ............ 386/92 |

* cited by examiner

*Primary Examiner*—Thai Tran
*Assistant Examiner*—Nigar Chowdhury
(74) *Attorney, Agent, or Firm*—Osha • Liang LLP

(57) ABSTRACT

A real time data compression apparatus examines whether a present read-in data point is in a predetermined tolerable error range. If yes, the previous data point is deemed as redundant and is ignored and after which a new data point is read in for comparing again. When a predetermined amount of data points is continuously ignored, it means the data is steady and only the final data point of these ignored ones is recorded. Otherwise, when data is varied greatly during a period, only the total amount of these varying data points and their value are recorded so the memory capacity for storing the compressed data is saved. Furthermore, the compressed data is stored in a form of a data structure in which the compressed data are expressed by multiple blocks. The block form allows increase of the efficiency of the searching process of the compressed data.

6 Claims, 6 Drawing Sheets

REAL TIME DATA COMPRESSION APPARATUS FOR A DATA RECORDER

CROSS REFERENCE

This is a divisional application of an U.S. application Ser. No. 10/623,671, which is now pending.

BACKGROUND OF THE INVENTION

1. Field of the Invention

The invention is related to a real time data compression apparatus applied for a data recorder, and more particularly to an apparatus that possesses superior data compression ability even when data is rapidly varied so that significant storage capacity is available. The compressed data is further stored with a particular format that allows the searching process for these compressed data to become much quicker.

2. Description of Related Arts

In many industrial applications, a variety of data reading must be recorded, such as the temperature reading, pressure value, flow rate or electric power reading, etc. Conventionally, all variations of these readings are stored by a data storage device and printed on paper to observe their possible varying tendency. In recent years, in accordance with the fast development of the microprocessor, a lot of electrical recorders, also known as "paperless recorders", are presented to replace the conventional recorders.

These paperless recorders usually utilize a memory device to store the recorded data or readings. Since the recording process usually lasts for a quite long time, the memory storage capacity is a vital important factor that must be considered. Although lots of data compression methods are applied to reduce the size of the recorded data to spare a lot of available capacity in memory, these methods still have several shortcomings that need to be solved.

For example, one kind of the fan compression methods entitled SASP2 is to examine whether a new reading is in a predetermined tolerable range. If so, the reading is ignored, otherwise the reading will be recorded. With reference to the upper line on FIG. 5, each point located on the line individually represents a sampled data point. The substantially closed fan-shaped region between two adjacent sample points represents the tolerable error range, wherein each tolerable error range is predicted based on the previous data sample point. The compression method is that if the present read data point $X_i$ is in the tolerable range, the previous data point $X_{i-1}$ is ignored. On the contrary, if the present one exceeds the tolerable range, the previous data point is recorded. Another line segment shown in the lower part of FIG. 5 represents actual variations of a series of the read data points.

However, the data compression method is capable of providing a superior compression efficiency only when the data variation is slow. When readings are varied rapidly in a period, almost all data points during the period must be recorded its position and value, which leads to the compression becoming inefficient.

Furthermore, based on the conventional compression method, the recorded information for a data point includes the sampling time, the position and the value of the data point. Based on the present computer recording format, a complete sampling time must be represented by 8 bytes. However, such a format is unfavorable for saving the memory capacity.

To overcome the mentioned shortcomings, a real time compression apparatus for a data recorder in accordance with the present invention obviates or mitigates the aforementioned problems.

SUMMARY OF THE INVENTION

The main objective of the present invention is to provide a real time compression apparatus for a data recorder to effectively compress data even when the data is varied quickly so that more memory capacities are saved.

To achieve the objective, the apparatus examines whether a present read in data point is in a predicted tolerable error range. If yes, the previous data point is deemed as redundant and is ignored and after which a new data point is read in for examining again. When such an "ignore" situation repeatedly lasts for a predetermined period, it means the extent of data variation is small and only the final data point is recorded.

Otherwise, if multiple continuously examined data points during an examining period all exceed the predetermined tolerable error range, each value of these data points and a total amount value of these data points are recorded.

A second objective of the present invention is to provide a compression data structure that is suitable to be employed in the data searching process.

To achieve of the objective, the data structure is composed of a main region and a second region.

The main region stores two kinds of parameters, where the first parameter is the total amount of the accumulated data points between two recorded data points, and the second parameter represents the values of the recorded data points.

The secondary region stores the start time when the data is initially recorded, the sample time interval, the starting time and starting position of each block.

In the data searching process, because the secondary region has the starting time of the block, the searching process is firstly performed on the secondary region to find a block that contains the desired data. Based on the known block, the searching process is then performed on the first region to obtain the desired data.

It is noted that the starting time of each block recorded in the secondary region, which is expressed by the times of the sampling interval relative to the start time when the data is initially recorded. So the starting time is able to be stored in the form of 4 bytes so that the storage capacity is able to be saved.

A further objective of the present is to provide a data compression apparatus, which includes:

a processing unit to perform the data compression process;

an interface unit connected to the processing unit through a connecting interface, wherein the interface unit includes a microprocessor and an A/D converter that converts the measured analog signals to the digital form and then transmits the digital signals to the microprocessor;

a storing unit connected to the processing unit through the data/address bus for storing the compressed data.

The apparatus is able to be connected with a measuring instrument via the interface unit and converts the measured signals to the digital form, then the digital signals are further compressed and stored in the storing unit.

The features and structure of the present invention will be more clearly understood when taken in conjunction with the accompanying figures.

DETAILED DESCRIPTION OF THE PREFERRED EMBODIMENT

In the present invention, a real time data compression method applied for a data recorder is disclosed. The compressing processing performed on data is deemed as segment by segment, and further based on the variation extent of the data to determine the compression format. In the compression method, a present read data point is examined to determine whether it is in a predetermined tolerable error range, where the tolerable error range is predicted based on a previous data point. According to the examined result, the previous data point is determined to be ignored or not. When the data remains steady or the variation extent is small during a period, the quantity of the recorded data points is accordingly less than that when data is rapidly varied. Thus, based on the amount of the recorded data points, the extent of data variation is obtainable so that the compression format is able to change in real time.

The real time data compression method for a data recorder that sequentially reads a plurality of sampled data points, the method comprising the steps of:

setting the first sampled data point as a starting point $X_0$;

sequentially examining the plurality of data points, wherein a present data point $X_i$ being examined is determined whether it is in a predetermined tolerable error range; wherein if the present data point $X_i$ is in the predetermined tolerable error range, a previous data point $X_{i-1}$ is ignored;

wherein the previous data point $X_{i-1}$ and the total amount of data points accumulated from the starting point $X_0$ to the previous data point $X_{i-1}$ are recorded, and the previous data point $X_{i-1}$ is then set as a new starting point, when (a) the present data point $X_i$ exceeds the predetermined tolerable error range or (b) the amount of the ignored data points reaches to a first predetermined amount;

wherein during a period that the sampled data points are varied quickly, and when the amount of the continuously examined data points is less than a second predetermined amount, the total amount of the data points that exceed their respective predetermined tolerable error ranges and the value of each of these data point are recorded.

Figure 1:
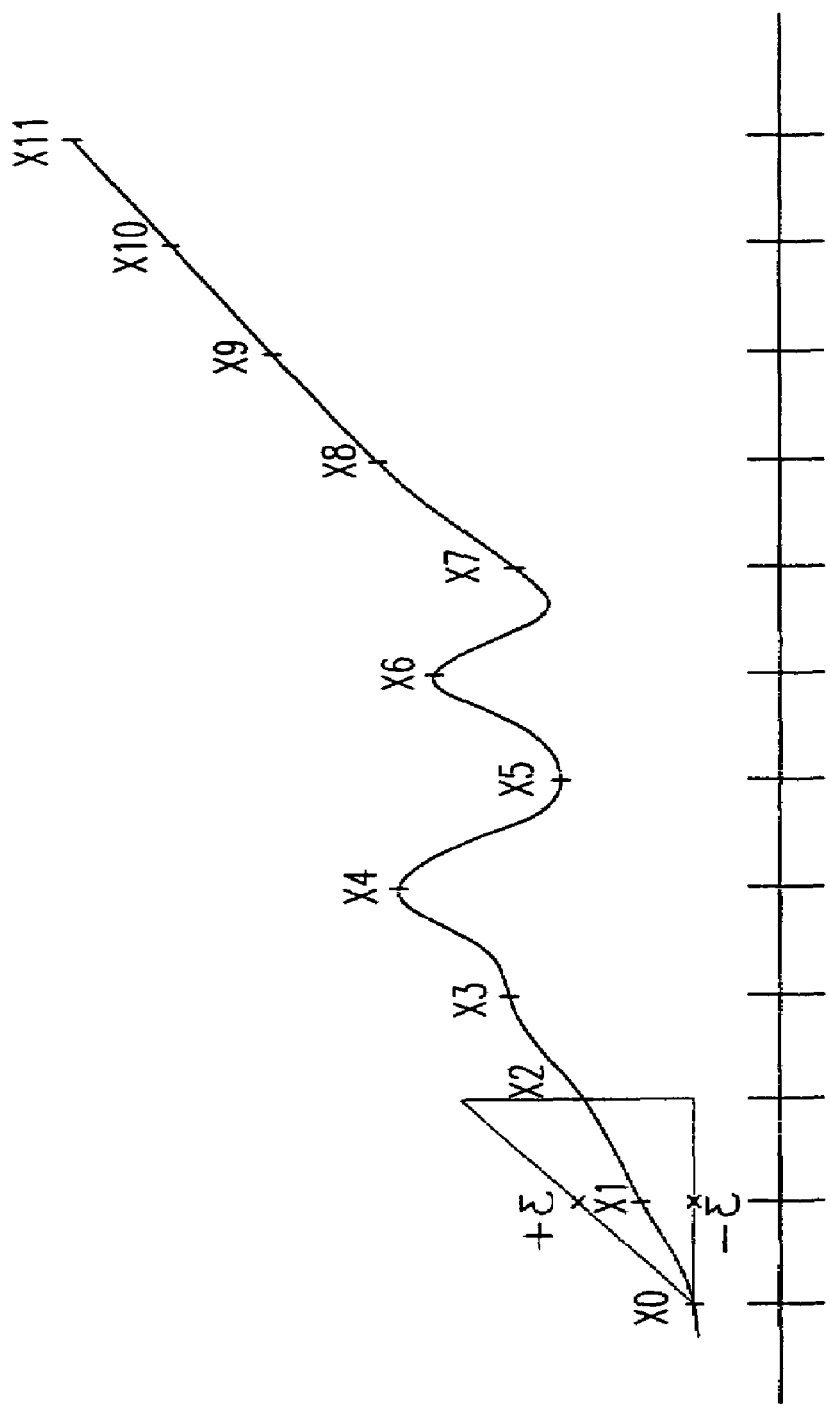
FIG. 1 is a diagrammatic representation of the means of a data compression method in accordance with the present invention.

In order to explain the present invention in detail, a curve that represents the data variation extent is illustrated in FIG. 1, where the lateral direction represents the time and X0 to X11 each represents a sampled data point during the sampling period from t0 to t11.

When adjacent sampling points are sequentially read, the later one is examined to determine whether it is in a tolerable error range. If so, the previous data point is deemed as a redundant one and is accordingly ignored. In this example, X0 is a starting point and a fan region R1 is derived by three points, the X0, X1+ϵ and X1−ϵ, where "ϵ" is a preset error value. By extending the two lines formed by "X0 to X1+ϵ" and "X0 to X1−ϵ" to the next data point X2, the first predetermined tolerable range R1 is obtained, wherein the data point X2 is in the predicted tolerable range so that the previous data point X1 is able to be ignored. Since X1 is ignored, a second predetermined tolerable range R2 is obtained by X0, X2+ϵ and X2−ϵ. Again, because the next data point X3 is in the second predicted tolerable range R2, X2 is also ignored.

During the examining process, the quantity of the ignored data points is compared with a pre-determined value. When the quantity exceeds the pre-determined value, the latest data point is recorded even when it is in the tolerable error range.

As shown in FIG. 1, data point X4 is out of the tolerable range deriving from the X0, X3+ϵ and X3−ϵ.

Conventional recording method must stores two parameters, the quantity of data points accumulated from X0 to X3 and the value of the data point X4. The recording format is expressed in a form of (n3, X3), where n3 means the quantity from data points X0 to X3. Then, the data point X3 is used as a new starting point for next round. A new tolerable range applied to examine data point X5 is derived from data point X3, X4+ϵ and X4−ϵ. In this example, X5 also exceeds the tolerable range. Still referring to FIG. 1, data points X5 is not in the predicted tolerable range obtained from X3, X4+ϵ and X4−ϵ. According to the aforementioned rule, the quantity of the data points from X3 to X4 and the value of X4 must be recorded in the form of (n4, X4), and then the data point X4 is deemed as a new starting point for next round. Similarly, since X6 exceeds the predicted tolerable error range, so (n5, X5) is recorded. With such a conventional data recording format, a lot of memory capacities is required.

The present invention improves the conventional method by such a means described hereinafter. When a present data point Xi is examined to determine whether it is in the predicted tolerable range, and it is found that the present data point Xi or one of the two previous data points $X_{i-1}$, $X_{i-2}$ is not in its predicted tolerable range, the previous data point $X_{i-1}$ is temporarily stored in a register. Once there are three continuous data points are all in their respective predicted tolerable ranges, the data recording means returns to normal and is the same as the conventional means. The total amount of the temporarily stored data points is expressed with a negative number. For example, data points X4 to X7 all exceed their correspondingly tolerable error ranges in FIG. 1, data variation is quite quick in the duration t4 to t7. All the data points from X4 to X7 must be recorded. A recording format for these points is expressed by (−4, X4c, X5c, X6c, X7c). In this format, the first parameter "−4" means the amount of the data points during the period X4 to X7 and is further provided with a negative sign.

The other parameters (X4c, X5c, X6c, X7c) respectively represent the values of the data points (X4, X5, X6, X7). Quite obviously, for the data points that have a great extension of variation, since they are not individually expressed by two parameters as performed by the conventional method SASP2, the recorded information is much less and more memory capacities are saved.

Figure 2A:
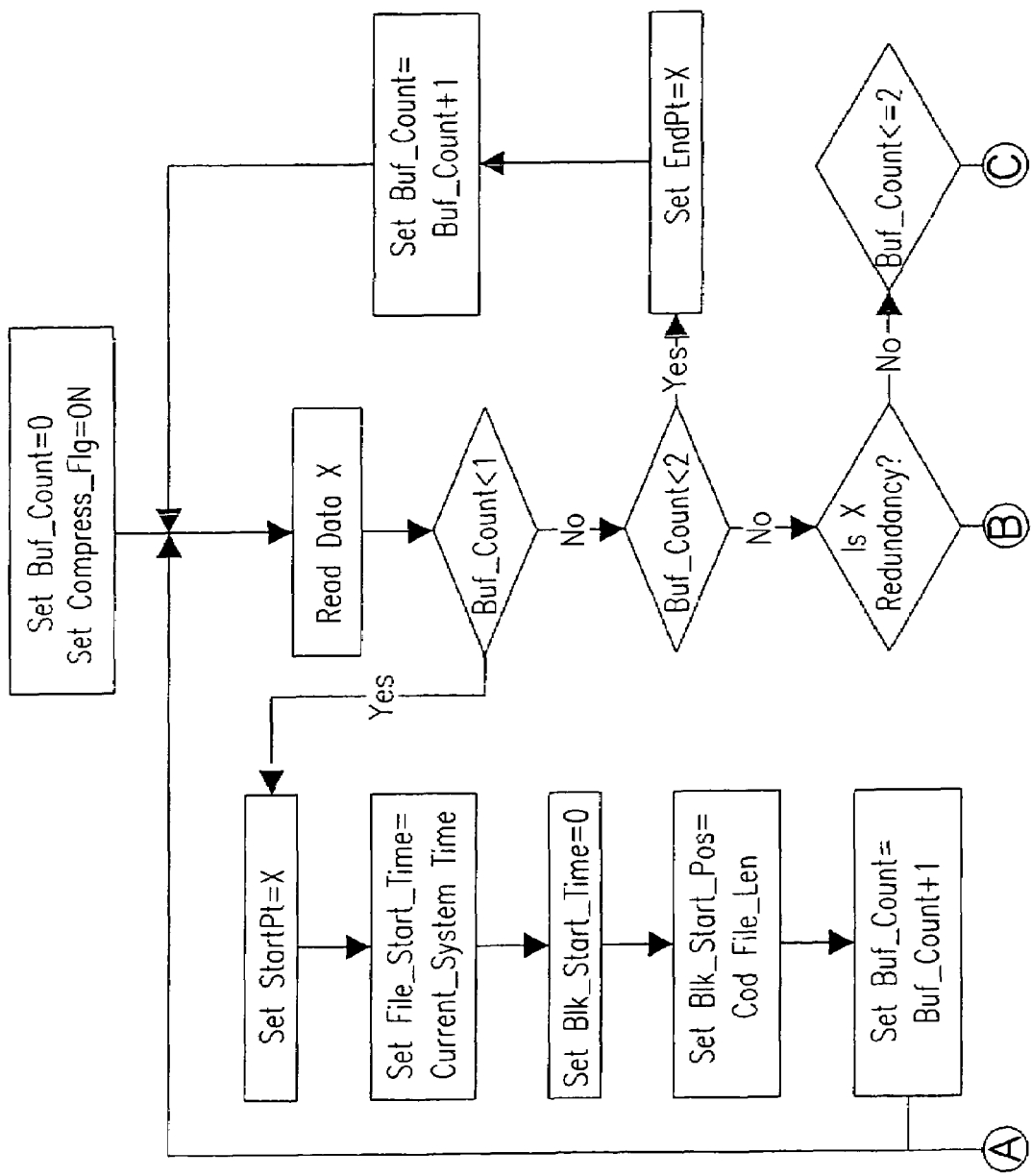
FIGS. 2A-2B show a flow chart of the compression method in accordance with the present invention.
Figure 2B:
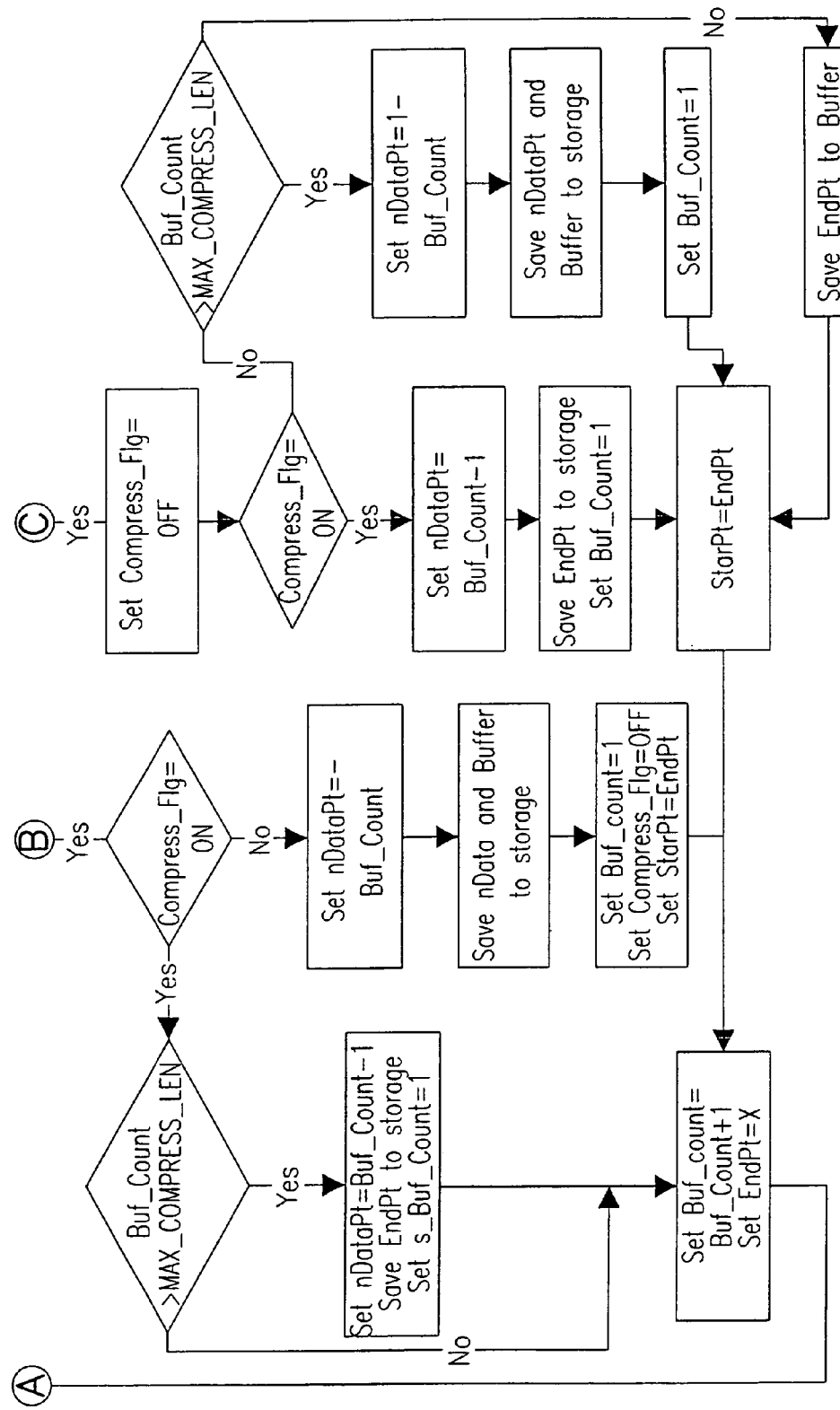

With reference to FIG. 2, a flow chart of the method is shown. The main steps of which are listed below.

1. Read sample points X1 and X2 and set StartPt=X1, EndPt=X2, Buf_count=2 and compression flag=ON;
2. Read a new data point X and examine whether the EndPt is redundant;
3. If the EndPt is redundant, then
   (1) If the compression flag is ON, then
      (i) Examine whether Buf_count has exceeded or is equal to a maximum compression length;
         (a) If yes, set nData=Buf_count−1, and store nData and EndPt into a storage media. Then set the Buf_count=1.
   (2) If the compression flag is OFF, then
      (i) Set nData=−Buf_count, save nData and all data in a buffer into a storage media;
      (ii) Set StartPt=EndPt;
      (iii) Set compression flag is ON;

(3) Set Buf_count=Buf-count+1, EndPt=X;
(4) Return to step 2;
4. If the EndPt is not redundant, then
(1) If Buf_count<=2, then set the compression flag is OFF;
(2) If the compression flag is ON, then
   (i) Set nData=Buf_count−1, and store nData and EndPt into a storage media;
   (ii) Set Buf_count=1;
(3) If the compression flag is OFF, then
   (i) Examine whether Buf_count has exceeded or is equal to a maximum compression length;
     (a) If yes, set nData=1−Buf_count, store ndata and all data in a buffer into a storage media and set Buf_count=1;
     (b) If not, store EndPt to the buffer;
(4) Set Buf-count=Buf_count+1 and EndPt=X;
(5) Return to step 2;

From the foregoing description, nData represents the total quantity of data points calculated between two recorded data points. Thus, if the sampling interval is maintained at constant, nData is deemed as the time span between two recorded data points. If the time of a particular recorded data point is intended to know, it can be obtained by sequentially accumulating nData values from the first recorded data point to the expected recorded data point, where the initial time must be added. However, such a calculation way may cause two problems. The first problem is that the calculation process will spend a lot of time if a great quantity of data points are stored. The second problem is that after the data recorder is shut down, there are no data points being stored during the period from the recorder been shut down to be re-activated, and thus nData is unable to precisely represent the time information. To solve the two problems, the present invention provides a particular data structure that is suitable to be applied in the data searching.

Figure 3:
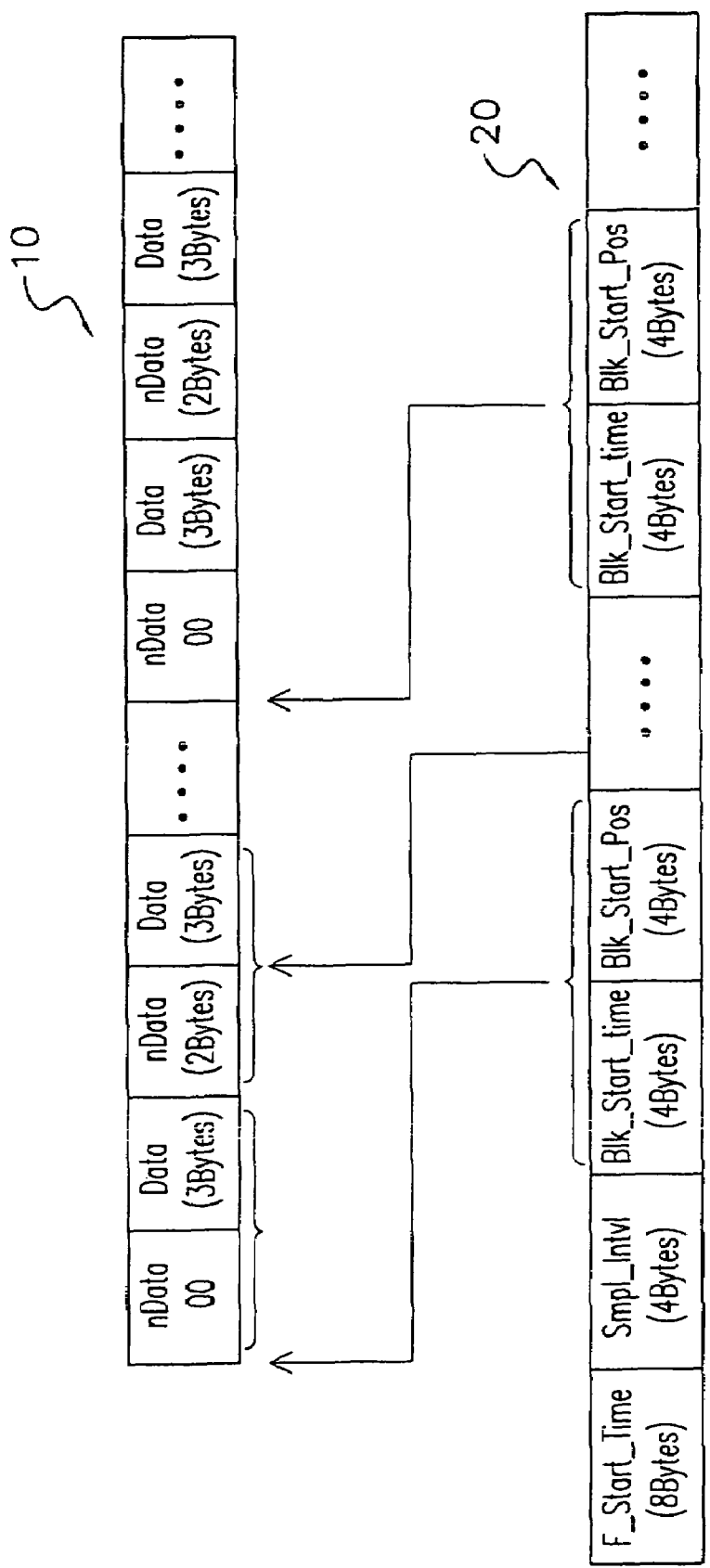
FIG. 3 shows a data structure in accordance with the present invention.

With reference to FIG. 3, the data structure comprises a main region (10) and a secondary region (20), wherein the main region (10) is composed of multiple segments. Each segment is provided to record two types of parameters, nData and Data, where a "ndata" accompanied with a "Data" represent one recorded unit. Each "nData" occupying two bytes representing the amount of the data points, where the amount is calculated between the present recorded data point and the previous recorded data point. Each "Data" parameter with 3 bytes represents the value of the present recorded data point.

The secondary region (20) is composed of four types of information, an F_Start_Time occupying 8 bytes, an Smpl_intvl occupying 4 bytes, a plurality of Blk_Start_time each occupying 4 bytes and a plurality of Blk_Start_Pos each also occupying 4 bytes. The F_Start_Time means the time from which the sampling process starts. The Smpl_intvl means a time interval between two sampled data points. A complete block, which corresponds to a group of the recorded points, is composed of two parameters Blk_Start_time and Blk_Start_Pos.

The parameter "Blk_Start_time", which is expressed in the form of multiples of the Smpl_intvl, represents the starting time of the block, wherein the starting time of the block is relative to the F_Start_Time. For example, if the F_Start_Time is zero and the Smpl_intvl is two, the parameter "Blk_Start_time" is expressed as "5" when the starting time of the first block is occurred at ten (10/2=5). Since the parameter "Blk_Start_time", which is relative to the F_Start_Time, is expressed by the multiples of the Smpl_intvl, the parameter is able to be represented by fewer than eight bytes.

To search a desired data, a well known searching technique, such as the Binary Search method, is performed on the foregoing secondary region (20) to find out a particular block where the desired data located. Then, when the Blk_Start_Time of the particular block is obtained, the exact data can be found in the main region (10) based on the Blk_Start_Time.

The secondary region (20) is created by the following steps:

1. When the data recorder is activated initially and a first sample data point is stored, the time that the first sample data point being recorded is deemed as the start time of a first block (Blk_Start_Time), wherein the parameter Blk_Start_Time is stored into the secondary region (20). Meanwhile the position of the first block (Blk_Start_Pos) is also recorded in the secondary region (20). It is noted that in every time that the recorder is activated again, the first "nData" in the first segment of the first region is set to zero as an identifying symbol, and the value of first recorded data point is stored in the first "Data".

2. In the data compression process, when the stored data points reach to a predetermined amount, a new block is created. The starting time and the position parameter of the new block (Blk_Start_Time) (Blk_Start_Pos) are also recorded into the secondary region (20).

In the data decompression process, when the searching process has reached to the end of the previous block (i.e. the start position of the present block, Blk_Start_Pos), an end time of the previous block is able to be calculated. If the end time is less than the Blk_Start_time of the present invention, and "nData" at the beginning of the present block is zero, it can be understood that there is no data points during the end time of the previous block and the starting time of the present block. If the desired data is in the period, an empty-data symbol is employed to show this situation.

Figure 4:
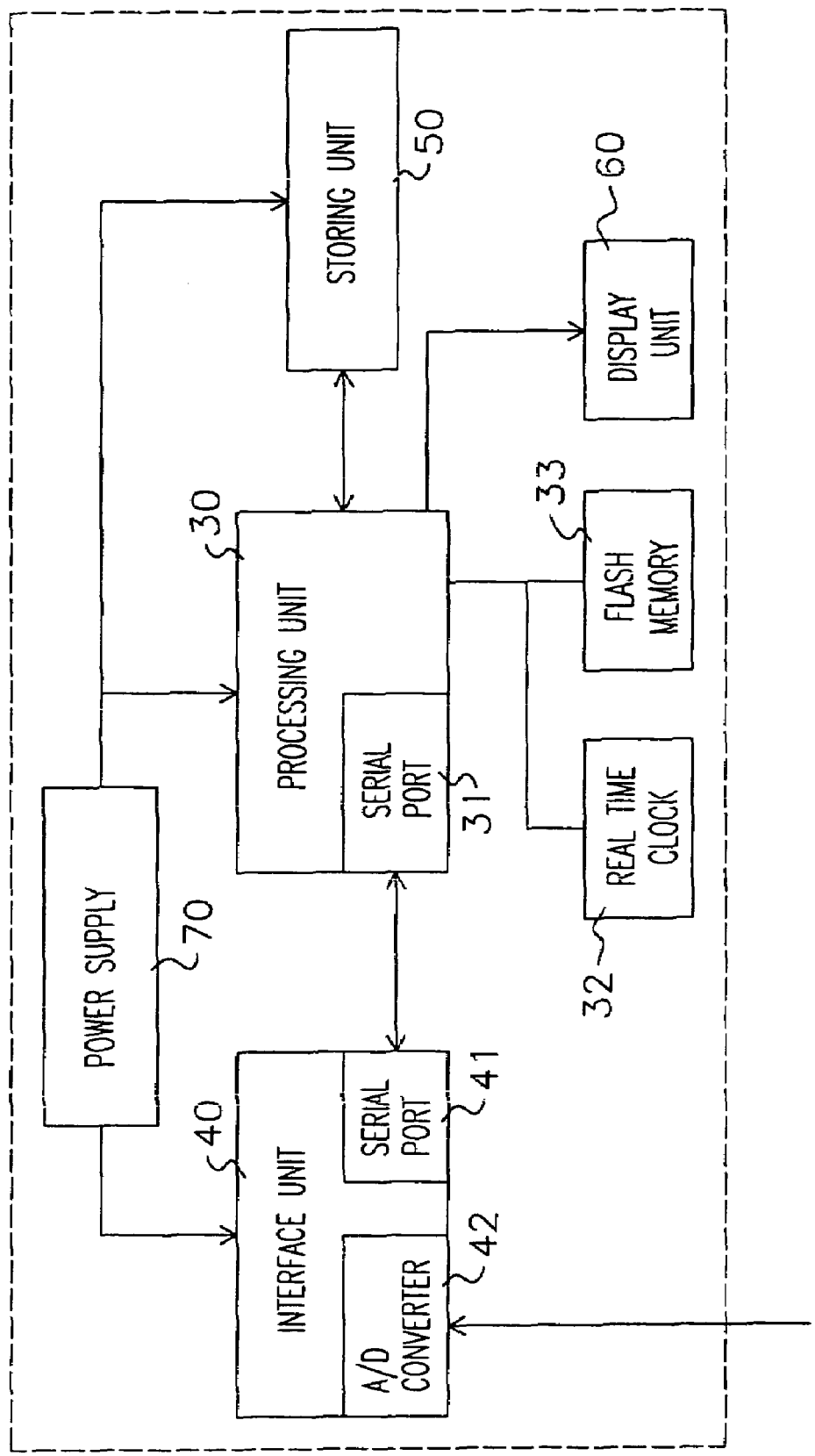
FIG. 4 is block diagram of an apparatus in accordance with the present invention.
Figure 5:
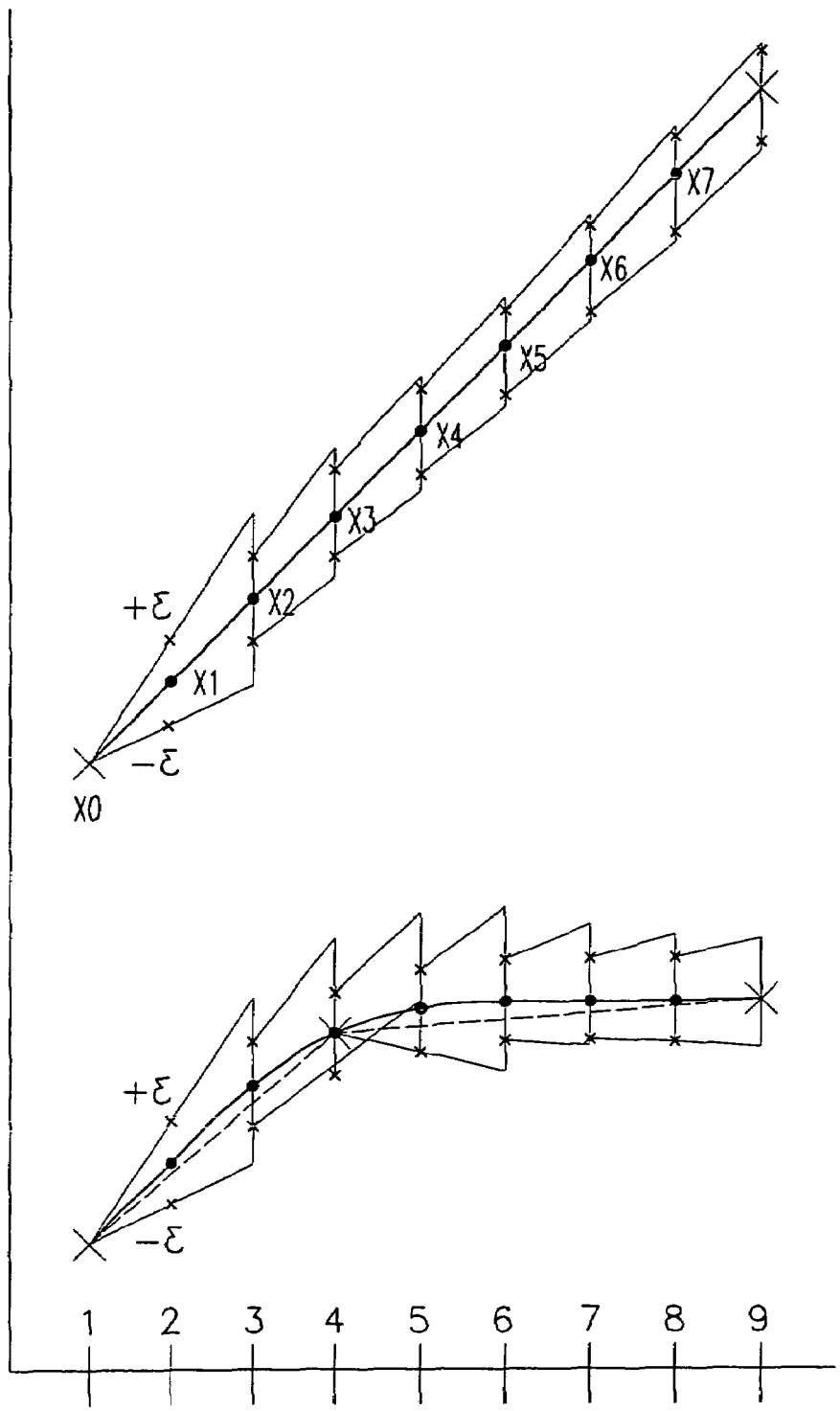
FIG. 5 is a diagrammatic representation of the means of a conventional fan method SASP2.

With reference to FIG. 4, an apparatus for performing the aforementioned method is illustrated. The apparatus comprises a processing unit (30), an interface unit (40), a storing unit (50), a display unit (60) and a power supply unit (70).

The processing unit (30) includes a microprocessor (not shown) that connects to a real time clock (32) and a flash memory (33), wherein the real time clock (32) regularly generates an interrupt requirement to inform the processing unit (30) for data recording and compressing. Further, the processing unit (30) has a first serial port (31).

The interface unit (40) provides a second serial port (41) to correspondingly connect to the processing unit (30) via the first serial port (31). The interface unit (40) also includes a microprocessor (not shown) and an A/D converter (42) that converts the measured analog signals to the digital form and then transmits the digital signals to the microprocessor. After which, the digital signals are transmitted via the two serial port (41, 31) to the processing unit (30).

The storing unit (50) is connected to the processing unit (30) through the data/address bus for storing the compressed data.

The display unit (60) is connected to the processing unit (30) to show the operating status.

When the interface unit (40) is connected to a measuring device and receives the measured analog signals generated from the measuring device, these analog signals are converted to the digital form and further output to the processing unit (30) for data compression. These compressed data are then saved in the storing unit (50) for data searching, then the searched result is shown by the display unit (60).

From the foregoing description, the method in accordance with the present invention has the advantages of:

1. Save significant memory capacities even when data are varied rapidly. Since the conventional fan compression method must save the position and value information of each recorded data point when data is changed quickly, a large storing capacity is required. However, the present invention does not record the position information of each recorded data point, so significant memory capacities are saved.

2. The searching efficiency is able to be improved. The present invention utilizes a secondary region to represent the compressed data in the form of block. Thus, when the searching process is firstly performed on the secondary region, a particular block that contains the information of the desired data is able to be found easily. Then based on the block, the desired data is easily acquired.

The foregoing description of the preferred embodiments of the present invention is intended to be illustrative only and, under no circumstances, should the scope of the present invention be restricted by the description of the specific embodiment.

What is claimed is:

1. An apparatus for real time data compression applied for a data recorder, the apparatus comprising:
   a processing unit for performing a data compressing process;
   an interface unit connected to the processing unit through an interface, adapted to connect to a measuring device to receive measured analog signals from the measuring device, and further including
   a microprocessor; and
   an A/D converter converting the measured analog signals to a plurality of data points and transmitting the data points to the microprocessor, and the microprocessor transmitting the data points to the processing unit to be compressed; and
   a storing unit connected to the processing unit through data/address bus for storing the compressed data according to a data format;
   wherein the data compressing process performed by the processing unit comprises steps of:
   setting the first data point as a starting point $X_0$;
   sequentially examining the plurality of the data points to determine whether every present data point $X_i$ currently examined is in a predetermined tolerable error range, and a previous data point $X_{i-1}$ is ignored if the present data point $X_i$ is in the predetermined tolerable error range;
   recording the previous data point $X_{i-1}$ and the total amount of data points accumulated from the starting point $X_0$ to the previous data point $X_{i-1}$, and setting the previous data point $X_{i-1}$ as a new starting point, when (a) the present data point $X_i$ exceeds the predetermined tolerable error range or (b) the amount of the ignored data points reaches to a first predetermined amount;
   wherein when the data points vary quickly during a period and the amount of the continuously examined data points is less than a second predetermined amount, the total amount of the data points that exceed their respective predetermined tolerable error ranges and the value of each of these data point are recorded;
   wherein the data format for the recorded data points has:
   a main region composed of multiple segments, wherein each segment has a predetermined length and stores
   the value of a presented recorded data point; and
   an amount of the data points calculated from a previous recorded data point to the present recorded data point; and
   a secondary region recording a start time that the data points are initially recorded, a sampling interval time and multiple blocks, wherein each block corresponds to several segments in the main region and includes a time value and a position value respectively representing a start time of the block and the start position of the block.

2. The apparatus as claimed in claim 1, wherein the processing unit is further connected to a real time clock and a flash memory, wherein the real time clock regularly generates an interrupt requirement to inform the processing unit for data recording and compressing.

3. The apparatus as claimed in claim 1, wherein the interface for connection of the processing unit to the interface unit has two serial ports that are respectively provided at the processing unit and interface unit.

4. The apparatus as clamed in claim 1, wherein the processing unit is further connected to a display unit.

5. The apparatus as claimed in claim 1, wherein the time value of each block is calculated relative to the start time at which the data points are initially recorded and is expressed by multiples of the sampling interval time.

6. The apparatus as claimed in claim 1 further comprising a power supply to provide an operating voltage to the processing unit, the interface unit and the storing unit.

* * * * *